(12) United States Patent
Sasaki

(10) Patent No.: US 7,718,460 B2
(45) Date of Patent: May 18, 2010

(54) SOLID STATE IMAGING APPARATUS

(75) Inventor: Shu Sasaki, Kitakami (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/130,057

(22) Filed: May 30, 2008

(65) Prior Publication Data

US 2008/0299696 A1    Dec. 4, 2008

(30) Foreign Application Priority Data

Jun. 1, 2007    (JP) ............................. 2007-147164

(51) Int. Cl.
*H01L 21/00* (2006.01)
(52) U.S. Cl. .................. 438/57; 257/292; 257/E27.131; 257/E27.132; 257/E27.133; 257/E27.139; 257/E27.146; 438/526
(58) Field of Classification Search .......... 257/E27.131, 257/E27.132, E27.133, E27.139, E27.146, 257/292; 438/57, 526
See application file for complete search history.

(56) References Cited

U.S. PATENT DOCUMENTS 6,521,925 B1    2/2003    Mori et al.
6,690,423 B1 *  2/2004    Nakamura et al. .......... 348/311
2002/0001039 A1  1/2002    Ishiwata

FOREIGN PATENT DOCUMENTS

| JP | 6-163971 | 6/1994 |
|---|---|---|
| JP | 10-135441 | 5/1998 |
| JP | 2007-109818 | 4/2007 |

* cited by examiner

*Primary Examiner*—A. Sefer
*Assistant Examiner*—Farid Khan
(74) *Attorney, Agent, or Firm*—Oblon, Spivak, McClelland, Maier & Neustadt, L.L.P.

(57) ABSTRACT

A method for manufacturing a solid state imaging device includes steps of forming a photodiode layer buried in a semiconductor substrate by ion injection and of forming a shielding layer buried in the photodiode layer by ion injection. At least in the ion injection process in the step of forming the shielding layer, an ion injection pause period is provided at least one time during whole ion injection step. According to the method, crystal defects are prevented from generating even if ion injection is performed with high energy, thereby suppressing dark current without complexity in manufacturing process.

5 Claims, 6 Drawing Sheets ion injection

SOLID STATE IMAGING APPARATUS

CROSS-REFERENCE TO RELATED APPLICATIONS

This application is based upon and claims the benefit of priority from the prior Japanese Patent Application No. 2007-147164, filed on Jun. 1, 2007; the entire contents of which are incorporated herein by reference.

BACKGROUND OF THE INVENTION

The present invention relates to a method for manufacturing a solid state imaging device and, in particular, to a method for manufacturing a photodiode layer and a shielding layer formed on the photodiode layer in a solid state imaging device.

In a photoelectric conversion element formed in the solid state imaging device, for example, a P-type impurity diffusion region is formed at a surface region of an N-type semiconductor substrate and a PN junction is formed at a boundary between these regions. The PN junction functions as a light receiving element which performs photoelectric conversion. On the P-type impurity diffusion region, an N+-type impurity diffusion region is formed. The N+-type impurity diffusion region functions as a shielding layer for protecting the P-type impurity diffusion region from incorporation of any other substance or from thermal energy in a manufacturing process. On the N-type semiconductor substrate formed with the P-type impurity diffusion region and the N+-type impurity diffusion region, an oxide film serving as an insulating film is formed on the whole surface thereof. On the oxide film, there is provided a gate electrode for transferring a signal charge produced by the photoelectric conversion element to a signal charge transfer section.

In forming the photoelectric conversion element for the solid state imaging device, conventionally, a shielding layer is formed by injecting an ion to be an impurity with high ion injection energy at a time. However, an energy range used for ion injection in forming the shielding layer, which is an impurity diffusion region, is much larger than the binding energy of atoms forming a crystal of a semiconductor substrate and therefore the atoms brought into collision with an incident ion are plastically deformed and are cut off from lattice points, thus generating crystal defect. The crystal defect caused by the plastic deformation weakens binding energy between lattices of semiconductor atoms and an energy level is formed in the energy level within a forbidden band where no crystal failure exists. Accordingly, a band gap becomes narrow and electrons move from a valence electron band to a conductive band in the forbidden band, thereby causing a dark current.

Generally, there has been used a method for recovering the crystal defect by annealing a semiconductor substrate which has undergone ion injection, however, a heavy metal trap during this process makes an energy level in the forbidden band, which causes a dark current.

For a solution of such a problem with ion injection process, there has been known a method for preventing crystal defect from generating even when high energy ion injection is performed.

Specifically, Japanese Patent Application Laid-Open No. 2007-109818 has disclosed that in forming an impurity diffusion layer, ion injection to the vicinity of a semiconductor substrate surface is performed with injection energy of at least 100 keV and at most 300 keV, using an ion having approximately same atomic radius as that of an element used for the substrate and, on the contrary, ion injection to a deep section of the semiconductor substrate is performed with injection energy of at least 300 keV and at most 4,000 keV, using an ion having approximately same mass as that of an element used for the substrate.

However, such a process requires use of different types of ions for forming the same impurity diffusion region, which causes a problem of complexity in a manufacturing process.

As described above, in a conventional process for forming an impurity diffusion layer, crystal defect occurs because ion injection is performed with high energy and hence dark current is generated. As means for solving the foregoing problems, there is a method for forming the same impurity diffusion region using different ions, however, this method has a problem of complexity in manufacturing process.

BRIEF SUMMARY OF THE INVENTION

It is an object of the present invention to provide a method for manufacturing a solid state imaging device, capable of preventing of crystal defect from generating even if ion injection is performed with high energy and of suppressing generation of dark current without complexity in manufacturing process.

According to one aspect of the present invention, a method for manufacturing a solid state imaging device includes steps of forming a photodiode layer buried in a semiconductor substrate by ion injection and forming a shielding layer buried in the photodiode layer by ion injection, wherein at least a pause period of ion injection is provided at least in the step of forming the shielding layer buried in the photodiode layer by ion injection.

According to another aspect of the present invention, a method for manufacturing a solid state imaging device includes steps of forming a photodiode layer including a second conductive type semiconductor layer of a predetermined depth from a surface of a first conductive type semiconductor substrate by ion injection and forming a shielding layer including a second conductive type semiconductor layer having higher concentration than the photodiode layer of a predetermined depth from a surface of the photodiode layer by ion injection, wherein at least a pause period of ion injection is provided at least in the step of forming the shielding layer buried in the photodiode layer by ion injection.

DETAILED DESCRIPTION OF THE INVENTION

The present invention will be described in detail by way of example with reference to the accompanying drawings.

Figure 1:
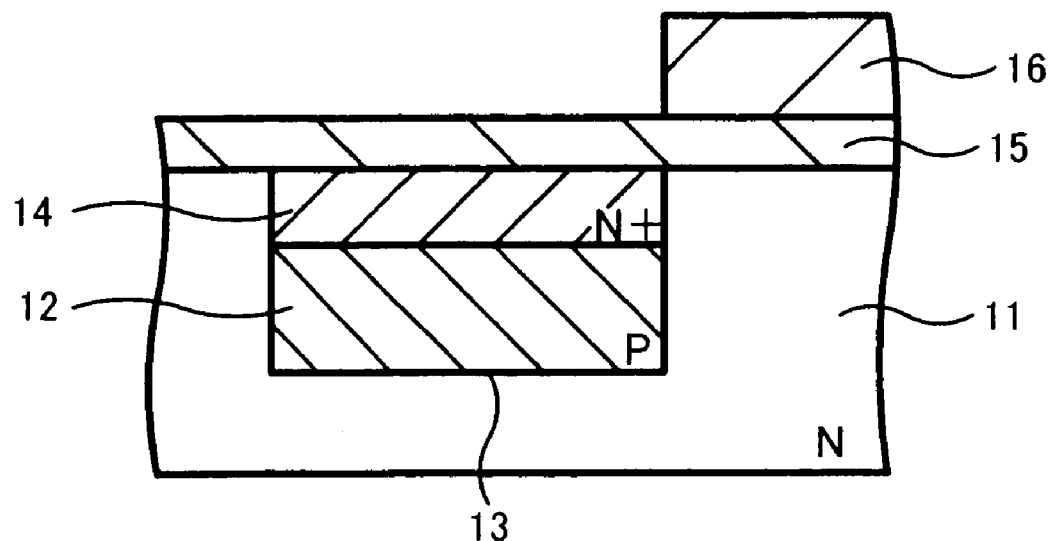
FIG. 1 is a sectional view illustrating a photoelectric conversion element of a solid state imaging device manufactured according to the present invention.

FIG. 1 is a sectional view illustrating a photoelectric conversion element of a solid state imaging device manufactured according to the present invention. As illustrated in FIG. 1, a P-type impurity diffusion region 12 is formed being buried in a N-type Si semiconductor substrate 11 by ion injection. A boundary section between the P-type impurity diffusion region 12 and the N-type Si semiconductor substrate 11 forms a PN junction, which composes a photodiode 13. An N+-type impurity diffusion region 14 is also formed being buried in the P-type impurity diffusion region 12 by ion injection. The N+-type impurity diffusion region 14 functions as a shielding layer of the P-type impurity diffusion region 12 as described above. An $SiO_2$ oxide film 15 serving as an insulating film is formed on the P-type impurity diffusion region 12 and the N-type Si semiconductor substrate 11 with the buried N+-type impurity diffusion region 14. There is disposed, at a section on the oxide film 15 and adjacent to the N-type Si semiconductor substrate 11, a gate electrode 16 for transferring signal charges generated by the photodiode 13 to a signal charge transfer section (not illustrated). The signal charges generated by the photodiode 13 can be transferred to the signal charge transfer section by applying a voltage pulse to the gate electrode 16.

Next, referring to FIGS. 2 to 5, a method for manufacturing such a solid state imaging device as shown above will be described. In the method for manufacturing a solid state imaging device, a solid state imaging device is manufactured according to a general method, except for the photoelectric conversion element and thus only the photoelectric conversion element will be described below.

Figure 2:
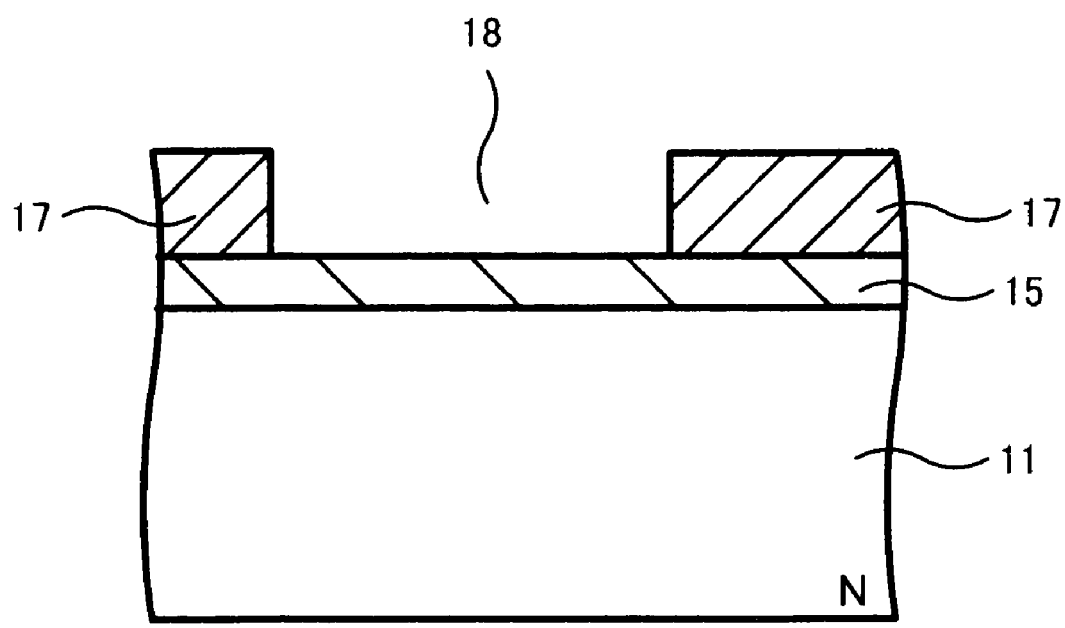
FIG. 2 is a sectional view illustrating a manufacturing process of a photoelectric conversion element of a solid state imaging device manufactured according to the present invention.

First, as illustrated in FIG. 2, the $SiO_2$ oxide film 15 is formed on a surface of the N-type Si semiconductor substrate 11. A resist film 17 is formed on the entire surface of the $SiO_2$ oxide film 15. An opening 18 is formed in the resist film 17 at a section for forming the photodiode 13, which serves as a mask for injecting an ion.

Figure 3:
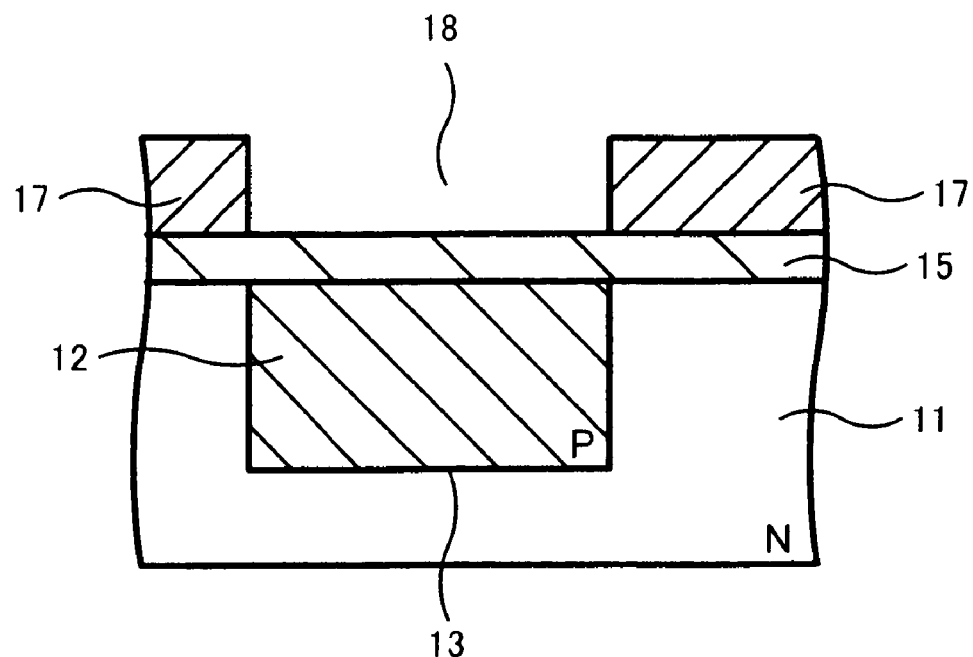
FIG. 3 is a sectional view illustrating a manufacturing process of a photoelectric conversion element of a solid state imaging device manufactured according to the present invention.

Next, impurities such as boron (B) and indium (In) are injected into the N-type Si semiconductor substrate 11 through the opening 18 in the mask by ion injection. Subsequently, the P-type impurity diffusion region 12 is formed as illustrated in FIG. 3 through an annealing process with a heat treatment.

Figure 4:
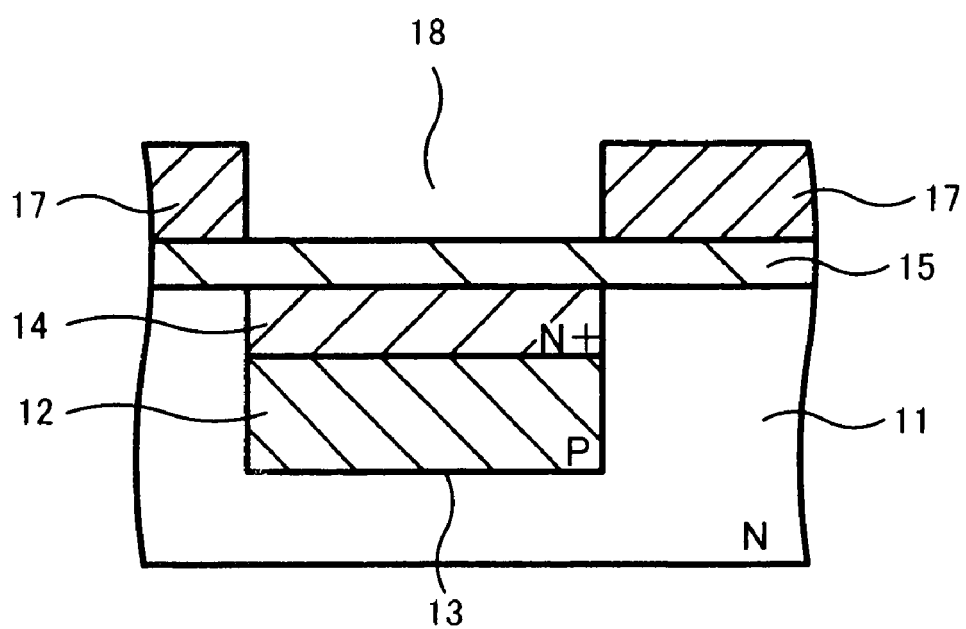
FIG. 4 is a sectional view illustrating a manufacturing process of a photoelectric conversion element of a solid state imaging device manufactured according to the present invention.

Then, through the opening 18 in the mask for ion injection, impurities such as phosphorus (P) and arsenic (As) are injected into a surface region of the P-type impurity diffusion region 12 by ion injection. In the ion injection process, after an ion injection is performed for a predetermined period with predetermined injection energy, ion injection is paused once. The pause period is, for example, 30 minutes to one hour. After the pause period has passed, ion injection is started again with approximately the same ion injection energy as in the ion injection process described above. The ion injection period is, for example, 300 seconds. That is, the process for forming the shielding layer is composed by at least two ion injection steps separated by the pause period and an amount of ion injection energy for each ion injection step is approximately the same. Subsequently, through an anneal process with a heat treatment, the N+-type impurity diffusion region 14 is formed in a surface region of the P-type impurity diffusion region 12, as illustrated in FIG. 4.

Finally, the resist film 17 formed on the N-type Si semiconductor substrate 11 is removed and, as illustrated in FIG. 1, the gate electrode 16 is formed on the oxide film 15 at a section adjacent to the N-type Si semiconductor substrate 11.

Figure 5:
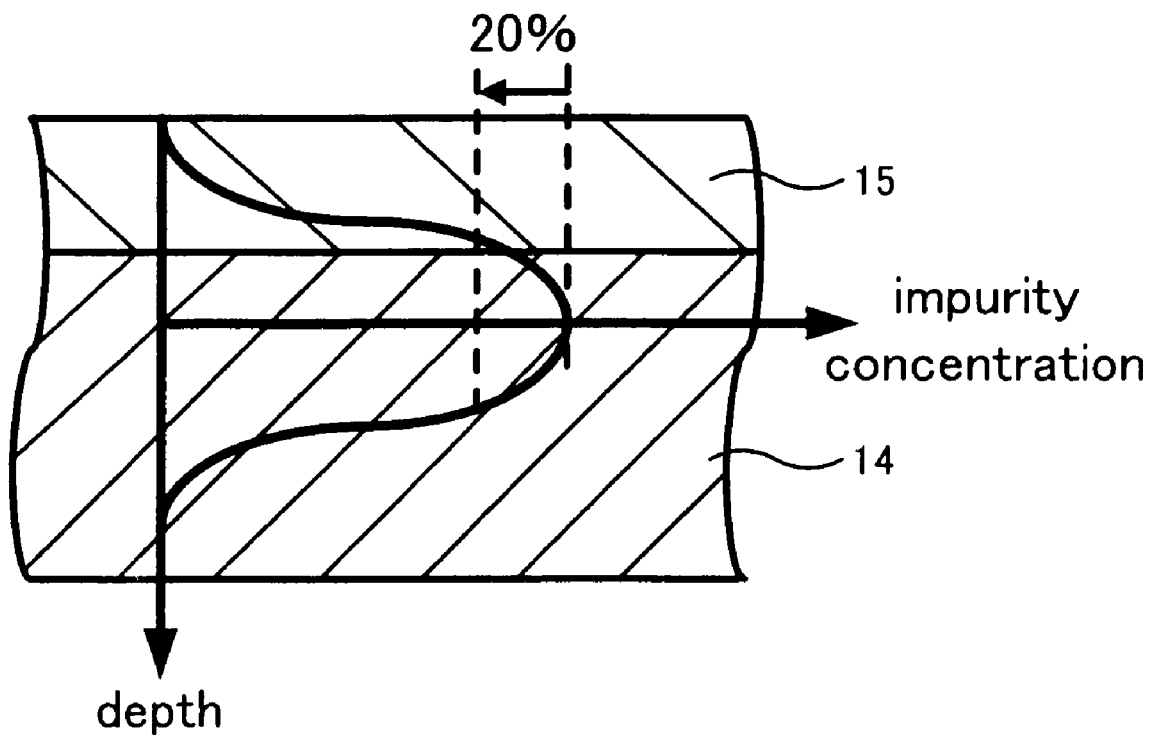
FIG. 5 is a view illustrating a method for determining ion injection energy required for performing ion injection according to the present invention.

The photoelectric conversion element is formed according to the process described above. In an ion injection process for forming the N+-type impurity diffusion region 14, ion injection is performed with predetermined ion injection energy by adjusting the thickness of the oxide film 15 and injection energy so that ion concentration is distributed as illustrated in FIG. 5 after injection of impurities. Specifically, a peak of the ion concentration distribution exists in the N+-type impurity diffusion region 14 and a section having a concentration of 80% of the peak of the ion concentration distribution exists in the oxide film 15 formed on the N+-type impurity diffusion region 14. Such a distribution of the ion concentration can be formed with ion injection energy of 20 keV or less. The ion injection period is, for example, 300 seconds. The pause period may be provided at a plurality of times. In this case, the energy amount is divided into a plurality of times so that ion injection energy is as low as possible.

In this way, a photoelectric conversion element for a solid state imaging device as illustrated in FIG. 1 can be manufactured.

Next, description will be made on a reason why the manufacturing method described above prevents the crystal defect from being generated referring to FIGS. 6A, 6B, 6C, 7A, 7B and 7C.

Figure 6A:
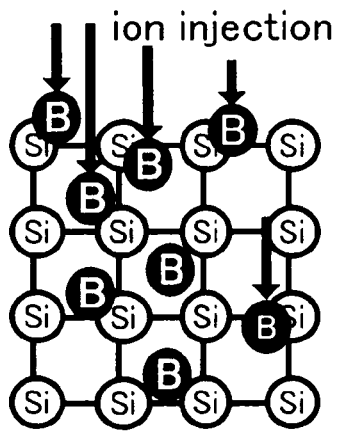
FIG. 6A to FIG. 6C are schematic views of a crystal structure of a Si semiconductor substrate to describe a principle of a method for manufacturing a solid state imaging device according to the present invention.
Figure 6B:
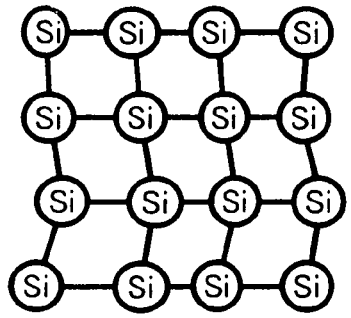
Figure 6C:
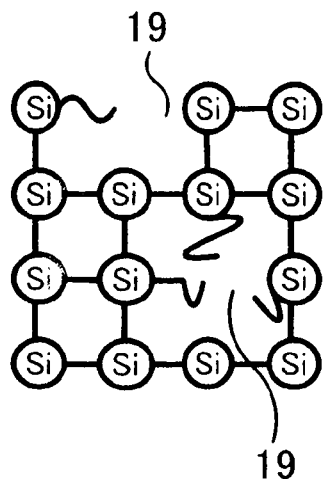

FIG. 6A illustrates a crystal structure of a Si semiconductor substrate into which an impurity ion B is injected. The ion injection gives a shock to a Si crystal forming the Si semiconductor substrate and thus the crystal receives distortion or deformation as illustrated in FIG. 6B. The crystal is subject to elastic deformation at an early stage. However, if injection energy is large or is applied for a long time, the deformation exceeds the limit of elastic deformation and reaches a domain of plastic deformation of the Si crystal as illustrated in FIG. 6C, where crystal bonding is partially cut off and broken, thereby producing the crystal defect 19.

Figure 7A:
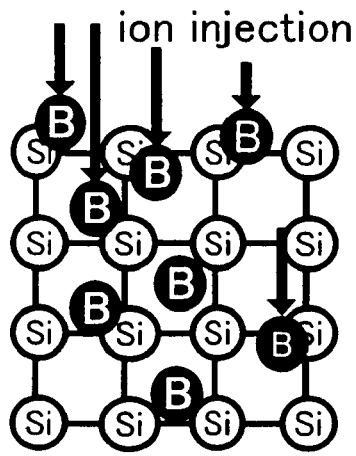
FIG. 7A to FIG. 7C are schematic views of a crystal structure of a Si semiconductor substrate to describe a principle of a method for manufacturing a solid state imaging device according to the present invention.
Figure 7B:
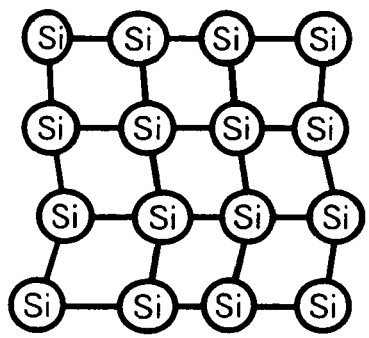
Figure 7C:
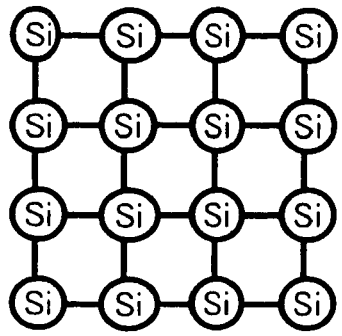

On the other hand, impurity ions are injected into the Si semiconductor substrate as illustrated in FIG. 7A and then the ion injection process is paused before Si semiconductor crystal reaches the domain of the elastic deformation as illustrated in FIG. 7B, where the crystal bonding returns to the initial state by elastic return as illustrated in FIG. 7C. Specifically, it has turned out that the bonding is elastically returns to the original state when an ion injection process is paused for at least approximately 30 minutes before a bonding state of Si atoms forming a crystal in an Si semiconductor substrate is subject to the plastic deformation. Repeating such an ion injection process intermittently, an impurity region having a desired ion concentration is formed without causing any crystal defects.

Figure 8:
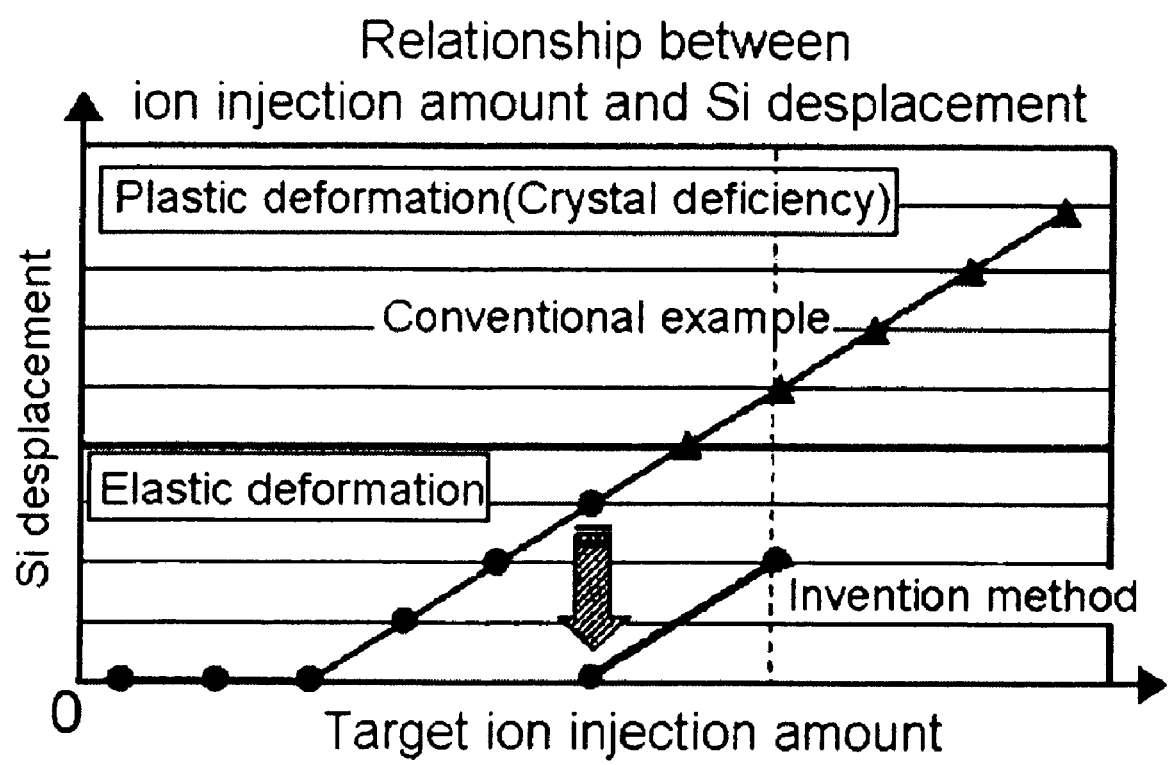
FIG. 8 is a view comparatively showing a relation between an amount of ion injected and displacement of atoms in a Si crystal forming a Si substrate in a method for manufacturing a solid state imaging device according to the present invention with that in a conventional manufacturing method.

FIG. 8 comparatively shows a relation between an amount of ion injected and displacement of atoms in a Si crystal forming a Si substrate in a method for manufacturing a solid state imaging device according to the present invention and the relation in continuous ion injection according to a conventional manufacturing method.

In addition, FIG. 8 illustrates that bonding of Si atoms forming crystal of the Si semiconductor substrate, in which a desired amount of the ion injection has been completed is subject to the plastic deformation in the case of a conventional process, but the bonding is kept within the elastic deformation in the case of using the ion injection method according to the present invention.

The ion injection method described above has been used for forming N+-type impurity diffusion region 14 in the present embodiment, but is also effective for an ion injection process for forming the P-type impurity diffusion region 12.

Further, the ion injection method according to the present invention is effective in forming a photoelectric conversion element of a different polarity from that of the present embodiment, specifically in forming an N-type impurity diffusion region which is buried in a P-type Si semiconductor to function as a photodiode and in forming a P+-type impurity diffusion region which is disposed on the N-type impurity diffusion region to function as a shielding layer.

As the pause period in the ion injection process, an appropriate period may be selected, provided that the period is within the range of 30 minutes to one hour. Further, the number of pauses for one ion injection process may be selected as needed.

What is claimed is:

1. A method for manufacturing a solid state imaging, comprising:
    forming a photodiode layer buried in a semiconductor substrate by ion injection; and
    forming a shielding layer buried in the photodiode layer by a process of a plurality of ion injections with a stoppage or pause period between the plurality of ion injections,
    wherein ion injection energy for forming the shielding layer is so selected that a depth showing a peak value of ion concentration distribution within the semiconductor substrate formed by ion injection may exist in the shielding layer and a depth showing an ion concentration value of 80% of the peak of the ion concentration distribution may exist in an oxide film formed on the shielding layer.

2. The method for manufacturing a solid state imaging device according to claim 1, wherein the step of forming the shielding layer includes at least two ion injection steps separated by the pause period and an amount of ion injection energy for each ion injection step for forming the shielding layer is approximately the same.

3. A method for manufacturing a solid state imaging device, comprising:
    forming a photodiode layer buried in a semiconductor substrate by ion injection; and
    forming a shielding layer buried in the photodiode layer by a process of a plurality of ion injections with a stoppage or pause period between the plurality of ion injections,
    wherein the stoppage or pause period between the plurality of ion injections is at least 30 minutes and at most one hour.

4. A method for manufacturing a solid state imaging device, comprising:
    forming a photodiode layer including a second conductive type semiconductor layer of a predetermined depth from a surface of a first conductive type semiconductor substrate by ion injection; and
    forming a shielding layer including a first conductive type semiconductor layer having a higher concentration than the photodiode layer of a predetermined depth from a surface of the photodiode layer by a process of a plurality of ion injections with a stoppage or pause period between the plurality of ion injections,
    wherein ion injection energy for forming the shielding layer is so selected that a depth showing a peak value of ion concentration distribution within the semiconductor substrate formed by ion injection may exist in the shielding layer and a depth showing an ion concentration value of 80% relative to the peak of the ion concentration distribution may exist in an oxide film formed on the shielding layer.

5. A method for manufacturing a solid state imaging device, comprising:
    forming a photodiode layer including a second conductive type semiconductor layer of a predetermined depth from a surface of a first conductive type semiconductor substrate by ion injection; and
    forming a shielding layer including a first conductive type semiconductor layer having a higher concentration than the photodiode layer of a predetermined depth from a surface of the photodiode layer by a process of a plurality of ion injections with a stoppage or pause period between the plurality of ion injections,
    wherein the stoppage or pause period between the plurality of ion injections is at least 30 minutes and at most one hour.

* * * * *